United States Patent [19]
Vongfuangfoo

[11] Patent Number: 5,392,932
[45] Date of Patent: Feb. 28, 1995

[54] BOAT TRANSPORT FOR SUPORTING SEMICONDUCTOR DEVICE ASSEMBLIES

[75] Inventor: Sutee Vongfuangfoo, Sunnyvale, Calif.

[73] Assignee: LSI Logic Corporation, Milpitas, Calif.

[21] Appl. No.: 996,459

[22] Filed: Dec. 24, 1992

[51] Int. Cl.⁶ .............................................. B65D 85/42
[52] U.S. Cl. ...................................... 211/26; 206/328
[58] Field of Search ................... 211/26; 361/346, 353, 361/354, 424; 206/560, 565, 328, 329, 330, 332

[56] References Cited

U.S. PATENT DOCUMENTS

| | | | |
|---|---|---|---|
| 3,652,974 | 3/1972 | Tems | 206/328 X |
| 3,850,301 | 11/1974 | Flenige | 211/26 |
| 3,892,312 | 7/1975 | Tems | 206/328 |
| 4,021,095 | 3/1977 | Kinkaid et al. | 206/330 X |
| 4,620,632 | 11/1986 | Alemanni | 206/329 |
| 4,725,922 | 2/1988 | Matsuoka | 206/328 X |
| 4,765,471 | 8/1988 | Murphy | 206/329 |
| 5,064,063 | 11/1991 | Manca et al. | 206/328 |
| 5,080,228 | 1/1992 | Marston, III et al. | 206/328 X |
| 5,103,976 | 4/1992 | Murphy | 206/565 X |
| 5,119,934 | 6/1992 | Karasawa et al. | 206/332 X |

*Primary Examiner*—Alvin C. Chin-Shue
*Assistant Examiner*—Derek J. Berger
*Attorney, Agent, or Firm*—Albert C. Smith

[57] ABSTRACT

A boat transport is fabricated to receive either pins-down or pins-up type semiconductor device assemblies, without damaging the pins, and to position the body of the semiconductor device assembly for subsequent packaging processes. The boat transport includes a planar platform for supporting a peripheral portion of the package body. A single large cutout through the platform receives all of the pins of the semiconductor device assembly. Guides which extend downward from the platform along each side (edge) of the cutout prevent lateral and rotational movement of a pins-down package. Other guides, which ascend upward from the platform along each side (edge) of the cut out, prevent pins-up packages from lateral and rotational movement. Additional cutouts through the platform accommodate chip capacitors.

5 Claims, 9 Drawing Sheets

BOAT TRANSPORT FOR SUPORTING SEMICONDUCTOR DEVICE ASSEMBLIES

TECHNICAL FIELD OF THE INVENTION

This invention relates to the assembly of semiconductor devices in a package, and particularly to steps in package assembly where the semiconductor device is sealed within a package body having pins extending from a surface thereof.

BACKGROUND OF THE INVENTION

As used herein, a "semiconductor device" is a silicon chip (die) containing circuit elements on a face thereof, and a "semiconductor device assembly" is a silicon chip contained within a package and connected (wired or bonded) to conductive leads which exit the package.

A common type of semiconductor device assembly has a plurality of pins exiting a surface of the package body, and is termed a Pin Grid Array (PGA). FIG. 1 shows a typical PGA 100, which includes a square, flat ceramic package body 102 having a top surface 102a and a bottom surface 102b and an opening 104 which extends into the top surface of the package. The body 102 has a length L1 and a width W1. A plurality of pins 105 extends outward from the bottom surface 102b, and are electrically connected (not shown) to lead fingers (die bond sites) 106 which extend within the opening. Typically, the pins 105 are laid out in a square array pattern of rows and columns. The outer rows (and columns) of pins span a distance L2 (L2<L1) lengthwise along the surface 102b of the package body 102, and span a distance W2 (W2<W1) widthwise along the surface 102b of the package body. This type of PGA is commonly referred to as a "pins down" PGA.

It is a common practice to attach external chip capacitors 107 to the package to enhance its performance. FIG. 1 shows the typical locations for mounting (attaching) the capacitors to the top surface 102a of a pins-down PGA, namely, generally around the periphery of the top surface 102a of the body. Chip capacitors are typically soldered on to gold plated pads, on the top surface 102a of the PGA, which are electrically connected to some of the pins 105. Evidently, the chip capacitors 107 extend above the top surface 102a of the body.

The complexity of modern semiconductor devices results in a high number ("count") of pins. Pin counts in excess of one hundred are not uncommon. For high pin count packages, the pins are necessarily very thin (small diameter) and are closely spaced. Spacing on the order of 0.070–0.100 inch (center-to-center) is not uncommon.

FIG. 1a shows a pin 105, having a length H1, attached to the ceramic body 102 having a thickness of T1. Typically, the pin 105 has a core 110 made of Kovar (an alloy of cobalt, nickel, and iron) or Alloy 42 (an alloy of nickel and iron), both of which are ferrous materials. In manufacturing a ceramic PGA, pins are attached to the ceramic body by a copper-silver composite brazing material 111. Typically, the braze area 111 has a nominal diameter of approximately 0.028 inches. The pin, including the braze material, is then plated with approximately 60 micro-inches of nickel 112, then 60 micro-inches of gold 113. The nickel plating prevents the braze material from diffusing into the gold, while the gold plating enhances electrical conductivity and prevents corrosion. The physical integrity of the pins is critical for proper alignment with and insertion into corresponding holes of a printed circuit board or a socket to which the packaged device is ultimately mounted. Removal of the plating is also a common damage mode and would allow for unwanted corrosion of the pins.

FIG. 1b shows the layout of pins 105 as they extend from the bottom surface 102b of the PGA. A central area 124 of the bottom surface 102b is left void of pins to allow automated machinery to lift the package during fabrication of the semiconductor device assembly. This is a "partially" populated PGA.

FIG. 2 shows a PGA-type semiconductor device assembly 200 similar in some respects to that of FIG. 1. The PGA 200 includes a square, flat ceramic package body 202, of length L1 and width W1, having a top surface 202a and a bottom surface 202b. However, in this version, an opening 204 extends into the bottom surface 202b of the package. A plurality of pins 205 extends outward from the bottom surface 202b, around the opening 204 and are electrically connected (not shown) to lead fingers (die bond sites) 206 which extend within the opening. This type of semiconductor device assembly is commonly referred to as a "pins up" PGA.

FIG. 2a shows the top surface 202a of the pins-up PGA 200 and the typical locations for attaching chip capacitors 209. Both versions (FIGS. 1 and 2) of the PGA are applicable to the present invention.

As was the case with the PGA 100, in the PGA 200 the pins 205 are arranged in an array of rows and columns. Outermost pins extend a width W2 (W2<W1) and a length L2 (L2<L1).

FIG. 3 shows a typical semiconductor device assembly 300, very similar to the PGA 100. A semiconductor die 306 is inserted into the opening 304, and is mounted within the cavity with an adhesive (e.g. epoxy; not shown). The die 306 is then connected to the exposed ends (bond sites) of the lead fingers 303 by any suitable technique (e.g. wire bonding or tape automated bonding). The top surface 302a of the package has a metallic ring 305 formed about the periphery of the opening 304. After the semiconductor device 306 is mounted in the opening and connected to the lead fingers 303, a lid 308 is secured over the opening 304, "sealing" the package. The lid is essentially a flat metal (or ceramic) plate, and is evidently slightly larger than the opening 304. The lid is commonly sized to fit over the ring 305. A solder "perform" foil 307 of similar size and shape as the ring 305 is provided between the lid 308 and the ring 305, so that the lid may be secured to the package body 302 simply by heating the entire assembly, causing the preform 307 to seal and secure the lid 308 to the top surface of the package 302 over the opening 304.

At the completion of the fabrication (packaging) process, each semiconductor device assembly is individually inspected, under magnification, for various defects (e.g. scarred or gouged pins, contamination, etc.). Any devices exhibiting such defects are rejected and thrown away, and represent an undesirable expense. Therefore prevention of such defects is a noble objective.

During the process of mounting the die in the package, and sealing the package, the entire assembly is typically passed through automated processing equipment (e.g. to wire bond the semiconductor die to the lead fingers 303, inter alia), and through conveyor belt furnaces (e.g. to melt the preform 307, inter alia). The packages are commonly placed on boat transports ("boats") during these various packaging processes.

FIG. 4 shows a portion of a boat 400 of the prior art, of a type suitable for receiving a pins-down type PGA (e.g. 100). The boat 400 is typically an elongated metal structure capable of supporting and transporting a number (e.g. six) of packages 100. The boat 400 is a rigid metal structure having a platform portion 403, a top surface 404a, a bottom surface 404b, and an area within the dashed line 405 for supporting the semiconductor device assembly (100, 300). The boat is provided with two side leg portions 406, so that the top surface 404a is maintained a suitable distance above a transporting surface (e.g. conveyor belt; not shown).

A number of pin-receiving holes 408 are provided through the platform portion 403. The holes 408 are sized and spaced to allow the pins 105 to pass easily through the top surface 404a so that the package body (e.g., 102) rests directly on the platform 403.

Typically, the holes 408 are quite (about 0.020 inches) larger than the diameter of the pins 105, to allow easy insertion of the pins and to prevent gouging or scraping of the pin plating. However, this tolerance evidently allows the package 102 to move around, and allows the pins to contact the platform 403. Hence, some of the holes 408 are typically sized to be only slightly (e.g. 0.005 inches) larger that the pins 105, and these particular holes 408a act as guide holes, to accurately position the package on the platform and keep the package from shifting its position during packing operations (processes).

Evidently, the holes 408 and 408a are capable of gouging the typically softer plating material on the pins 105. Gouging and scarring of the pins arise during transport of the boat (i.e. from one process to another or within one process) when frequent vibration and jarring of the boat occurs and during the lifting and returning of the package during fabrication, as mentioned above. This problem is of great concern with respect to the braze area 120 (see FIG. 1a) where the effective pin diameter is at its greatest. This problem is also exacerbated by the smaller guide holes 408a on the boat.

As shown in FIG. 4, a larger cutout 407 extends through the platform portion 403 and is centrally located within the area 405. This cutout 407 allows automated process equipment to lift the semiconductor device assembly (100, 300) up off of the boat 400 during, and return it at the completion of, fabrication (packaging). The package is generally lifted once per assembly process (e.g. die attach, wire bond, etc.). Returning the package to the boat generates a violent collision between the package and the boat.

Additional cutouts 409 may be provided within the periphery of the area 405, to minimize the number of holes 408. Only relatively few holes 408, compared with the total number of pins 105 are needed.

Taking into account the cutout 407 and additional cutouts 409 the plate portion 403 is left with "bridges" 410 at two opposite sides of the area 405, and the bridges have a sufficient number of holes 408 to reasonably well align and maintain motionless a semiconductor device assembly 100.

As mentioned above, during the process of lifting the semiconductor device assembly and inserting the pins of the assembly into the holes 408, contact between the pins and the boat occurs because the boat is the direct support for the semiconductor device assembly. At the points of contact, motion of the semiconductor device assembly on the boat has been observed to cause the pin plating to be worn or scarred away, exposing either the under coat or the base metal, which can lead to undesirable corrosion.

FIG. 4a shows a portion of another embodiment of a prior art boat 420, of a type suitable for receiving a pins-up PGA (e.g., 200 of FIG. 2). Similar to the embodiment for the pins-down boat 400, this boat 420 is also an elongated metal structure capable of supporting and transporting a number of semiconductor device assemblies. The boat 420 is a rigid metal structure having a platform portion 423, a top surface 424a, a bottom surface 424b and an area within the dashed line 425 for supporting the semiconductor device assembly. The boat 420 is provided with two side leg portions 426 so that the top surface 424a is maintained a suitable distance above the transporting surface (e.g., of a conveyor or belt).

As shown in FIG. 4a, a large cutout 427 extends through the platform portion 423 and is centrally located within the area 425. A pair of corner "stops" 428 extend upward from the platform 423, outside the dashed line, at each corner of the area 425. Each stop 428 is punched and formed from the platform 423 (see exploded view in FIG. 4a) The stops 428 extend upward, perpendicular to the platform 423. The pins-up PGA rests on the platform area inside the corner stops 428 and the package body is positioned on the boat by the corner stops 428. Evidently, the pins of a pins-up PGA resting on the boat will extend away from (rather than through) the platform of the boat.

Hence it can be seen that in the prior art, two distinct boat transports (400,420) are required to handle pins-down and pins-up type packages (100,200). This involves designing and tooling one type of boat 400 for pins-up packages and another type of boat 420 for pins-down packages. This also involves keeping twice as many boats in inventory.

In any case, one of the main objectives in boats is not to damage the physical integrity of the pins. Prior art boats 400 for pins-down packages received package pins through an array of holes. Each hole is punched from the boat platform and left with a sharp edge. The array of holes minimize lateral movement of the package, relative to the boat. However, during the fabrication of a semiconductor device assembly, the package is lifted from and inserted into the boat frequently. During these operations the pins are commonly scratched, bent or scarred. Furthermore, collisions between the boat and package frequently occur during transport of the boat from one fabrication process to another. Contact points between the boat and package, in particular, the pin braze area, have often been observed to be scarred and gouged, removing the gold plating and exposing the underplating or base metal.

What is needed is a boat assembly that does not damage or package bodies. More specifically, what is needed is a boat assembly capable of supporting both pins-up and pins down PGA's and which does not contact the pins.

DISCLOSURE OF THE INVENTION

It is an object of the present invention to provide an improved boat transport for handling semiconductor device assemblies.

It is another object of the present invention to provide a boat which prevents damage to the pins of a PGA semiconductor device assembly during handling and transport.

It is another object of the present invention to provide a boat which minimizes motion of a semiconductor device assembly.

It is another object of the present invention to provide a boat capable of being universally used for both pins-up and pins-down type PGA's.

According to the present invention, a boat transport has a planar platform having an area for supporting a peripheral portion of a semiconductor device assembly body, said peripheral portion being outside an area occupied by a pin array. A single, large cutout (opening) is provided through the platform, within the area for supporting the package body, and receives all of the pins of a pins-down semiconductor device assembly.

Further according to the present invention, the boat transport has pairs of downward-extending guides formed on each side of the cutout (opening), and these downward extending guides extend receive and locate the pins of a pins-down PGA.

Further according to the present invention, the boat transport has pairs of upward-extending guides formed on each side of the cutout, and these upward-extending guides receive and locate the package body of a pins-up PGA.

By providing both downward and upward extending guides on each side of the cutout, the boat transport is well adapted to receive either pins-down or pins-up type semiconductor device assemblies.

According to an aspect of the present invention, the downward extending guides descend from the top surface of the platform to at least a length of the pins to shield and protect the pins from inadvertent damage during packaging processes.

According to another aspect of the present invention, the upward extending guides rise from the top surface of the platform to a height approximately equal to that of the package body, and prevent lateral movement of a pins-up PGA.

According to another aspect of the present invention each guide forms a rounded and smooth intersection with the top surface of the platform. With respect to the downward-extending guides, this is especially beneficial in preventing scarring or gouging of the pin plating.

According to another aspect of the present invention, the distance between the downward extending guides on opposing sides of the cutout is slightly larger than the length of the outer rows (or columns) of pins so as to effectively prevent lateral movement of a pins down PGA.

According to another aspect of the present invention, the width (or length) dimension of the downward extending guides is sufficient to prevent rotational movement of the packaged semiconductor device assembly on the boat.

According to another aspect of the present invention, the distance between the upward extending guides on opposing sides of the cut out is slightly larger than the package body length and width, respectively, so as to prevent lateral movement of a pins-up package.

Hence it is seen that a boat transport of the present invention eliminates gouging and scarring of pins by the boat by holding the package on the boat platform by the ceramic body. Any remaining incidental contact between the pin and boat will not result in damage to the pin plating. Insertion of the pins through multiple individual small-size holes (e.g., 408) on the boat platform is thereby avoided. Furthermore, the boat transport of the present invention accommodates both (either) pins-down and pins-up packages, thereby eliminating the need for two distinct boat transports.

Other objects, features and advantages of the invention will become apparent in light of the following description thereof.

DETAILED DESCRIPTION OF THE INVENTION

Figure 4:
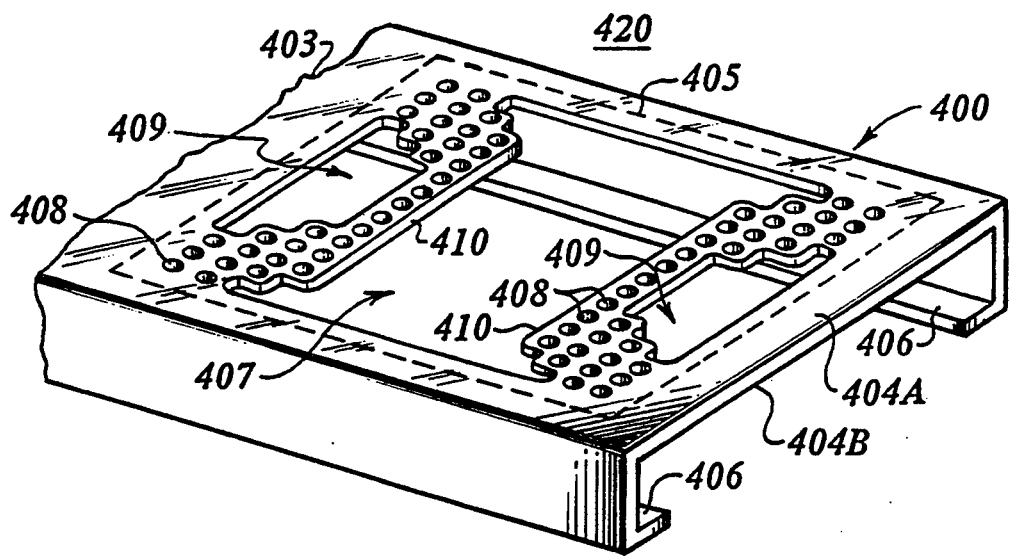
FIG. 4 is a partial perspective view of a prior art boat transport 400, for supporting pins-down PGAs.
Figure 4A:
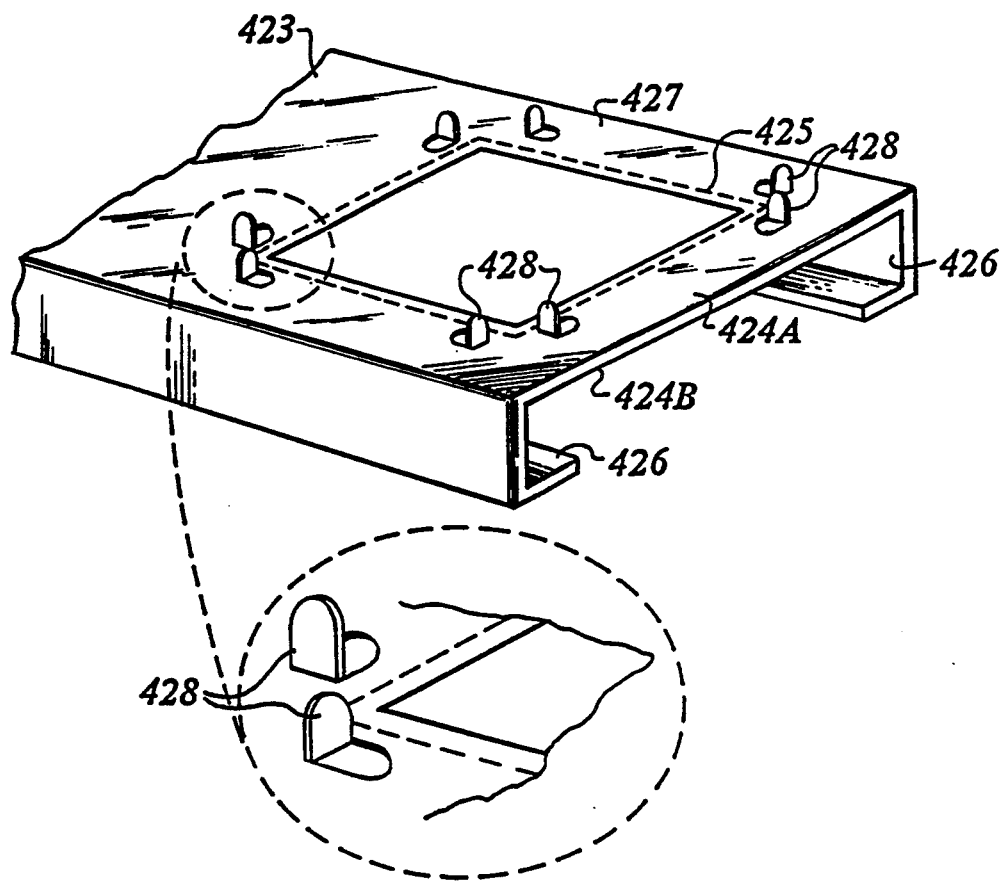
FIG. 4a is a partial perspective view of a prior art boat transport 420, for supporting pins-up PGAs.

Pins-up and pins-down packages have been discussed above (FIGS. 1, 1a, 1b, 2, 2a, 3), as well as boats (FIGS. 4 and 4a) for transporting the same. The present invention relates primarily to a boat transport which prevents damage to the pins of a semiconductor device assembly, and which can accommodate both pins-down and pins-up type PGAs.

Figure 5:
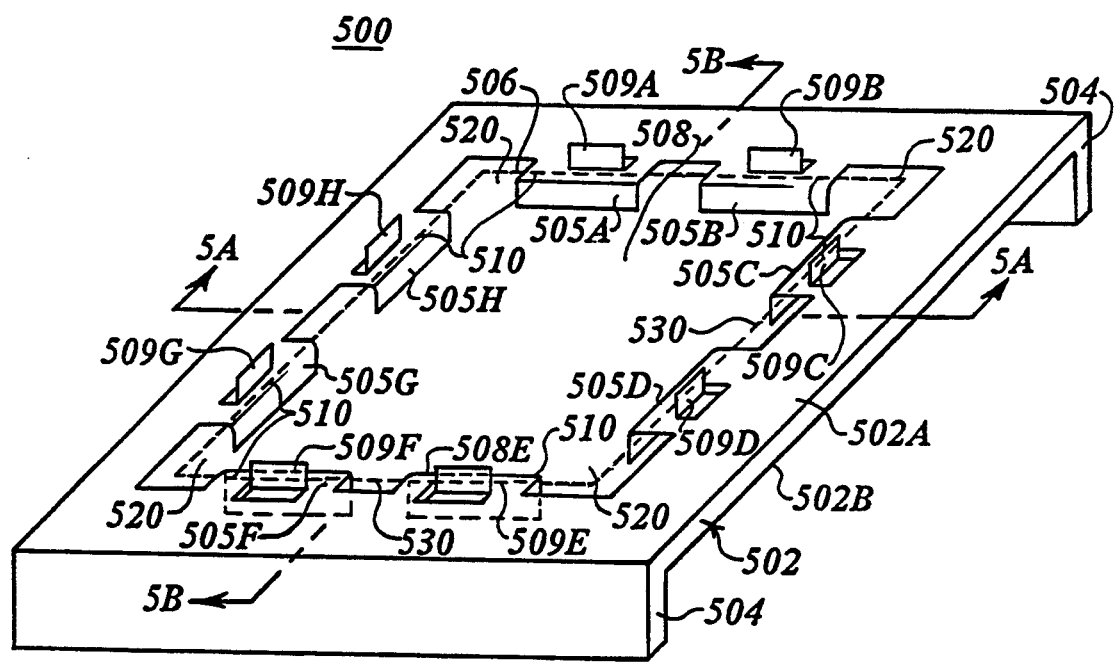
FIG. 5 is a partial perspective view of a boat transport 500, according to the present invention.
Figure 5A:
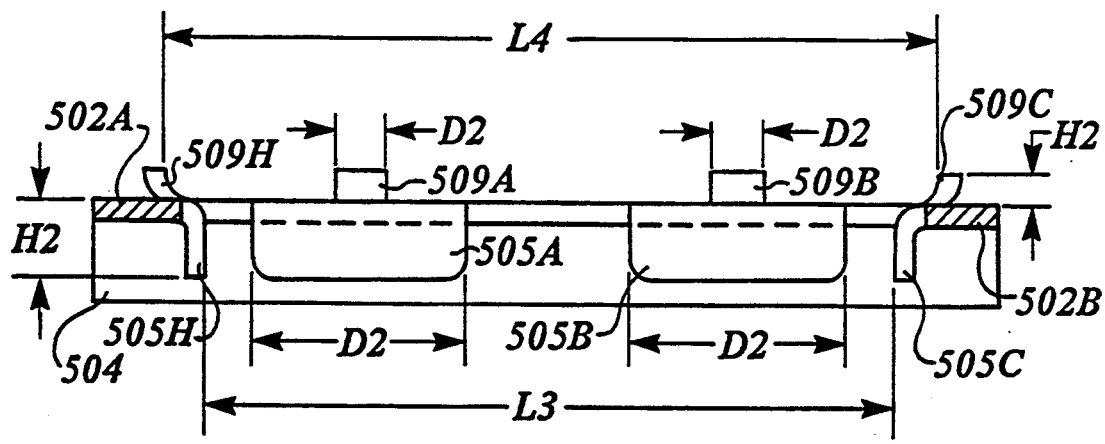
FIG. 5a is a cross-sectional side view of the boat transport 500 of FIG. 5, taken on a line 5a—5a through FIG. 5.
Figure 5B:
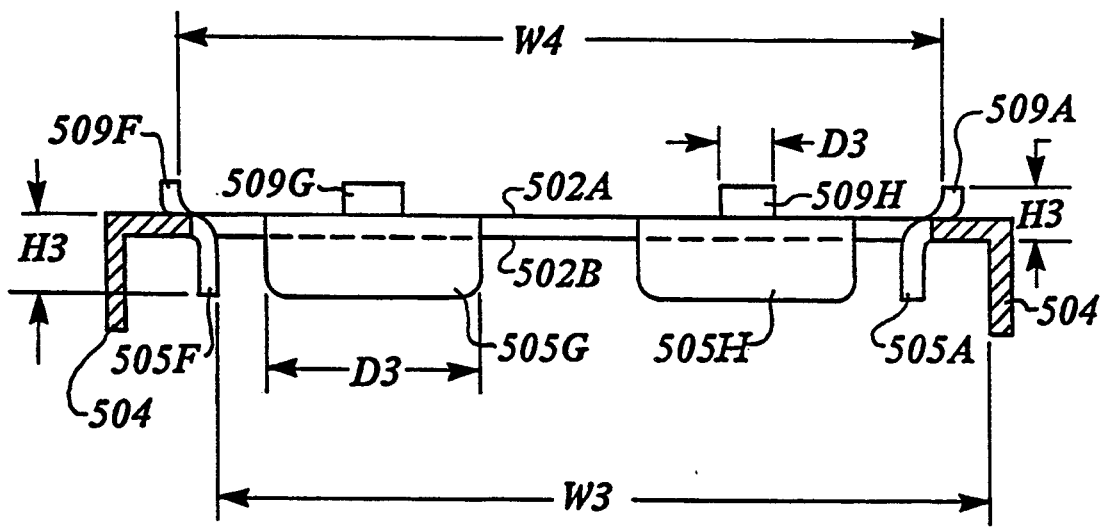
FIG. 5b is a cross sectional side view of the boat transport 500 of FIG. 5, taken on a line 5b—5b through FIG. 5.

FIGS. 5, 5a and 5b show a boat transport 500 according to the present invention. As was the case with the boat transports of the prior art 400 and 420, only a portion of the boat sufficient to transport one semiconductor device assembly (e.g., 100, 200, 300) is shown. As noted above, a boat typically transports up to six or more semiconductor assemblies during packaging operations.

As in the case with boat transports of the prior art, the boat transport 500 of the present invention is formed of sheet metal on the order of 0.030 to 0.040 inches stainless steel, has a platform portion 502, a top surface 502a, a bottom surface 502b, and side leg portions 504 extending downward from opposite side edges of the platform portion 502.

Again, as with prior art boat transports, the platform portion 502 of the boat transport 500 has an area 506

(shown as a dashed line) for receiving a semiconductor device assembly. This area 506 corresponds roughly in size and shape (usually square) to the length (L1) and width (W1) dimensions of the semiconductor device assembly package body. A single large cutout (opening) 508, which is generally square shaped, is provided through the platform portion 502, in a central region of the assembly supporting area 506, providing access for automated machinery to lift the semiconductor device assembly off of the boat. As will be discussed in greater detail hereinbelow, the single large cutout is sufficiently large that all of the pins of a PGA may pass through the opening 508 in the platform, without the need for several smaller holes (e.g., 408).

In marked contrast to the prior art, the present invention does not utilize a plurality of pin-receiving holes (408) to receive the pins of a semiconductor device assembly and to locate the assembly on the boat. Rather, according to the present invention there are provided two distinct sets of guides, formed integrally with the platform—namely: a downward-extending set of guides 505a . . . 505h sized according to the dimensions of the pin array, and an upward-extending set of guides 509a . . .509h sized according to the dimensions of the package body.

The downward-extending guides 505a . . . 505h are implemented as follows. A first set of downward-extending guides 505a and 505b are disposed along a first edge of the square cutout area 508. A second set of downward-extending guides 505e and 505f are disposed along a second edge of the square cutout area 508, opposite the first set of downward-extending guides 505a and 505b. A third set of downward-extending guides 505c and 505d are disposed along a third, intermediate edge of the square cutout area 508. A fourth set of downward-extending guides 505g and 505h are disposed along a fourth edge of the square cutout area 508, opposite the third set of downward-extending guides 505c and 505d.

The upward-extending guides 509a . . . 509h are implemented as follows. A first set of upward-extending guides 509a and 509b are disposed along a first edge of the square cutout area 508. A second set of upward-extending guides 509e and 509f are disposed along a second edge of the square cutout area 508, opposite the first set of upward-extending guides 509a and 509b. A third set of upward-extending guides 509c and 509d are disposed along a third, intermediate edge of the square cutout area 508. A fourth set of upward-extending guides 509g and 509h are disposed along a fourth edge of the square cutout area 508, opposite the third set of upward-extending guides 509c and 509d.

Further, as shown in the Figure, the upward-extending guide 509a is offset slightly outward from the downward-extending guide 505a, the upward-extending guide 509b is offset slightly outward from with the downward-extending guide 505b, the upward-extending guide 509c is offset slightly outward from with the downward-extending guide 505c, the upward-extending guide 509d is offset slightly outward from with the downward-extending guide 505d, the upward-extending guide 509e is offset slightly outward from with the downward-extending guide 505e, the upward-extending guide 509f is offset slightly outward from with the downward-extending guide 505f, the upward-extending guide 509g is offset slightly outward from with the downward-extending guide 505g, and the upward-extending guide 509h is offset slightly outward from with the downward-extending guide 505h.

As best viewed in FIG. 5a, the third and fourth pairs of downward extending guides 505c (505d not visible in this view) and 505h (505g not visible in this view) are separated by a distance L3, while the third and fourth pairs of upward extending guides 509c (509d not visible in this view) and 509h (509g not visible in this view) are separated by a distance L4.

The first and second pair of downward extending guides (505a,505b and 505e,505f) descend a distance H2 below the top surface 502a of the platform and each downward-extending guide projects a length D2 along each side of the cut out area 508.

The first and second pair of upward extending guides (509a,509b and 509e,509f) ascend a height h2 above the top surface 502a of the platform and each upward-extending guide projects a length d1 along each side of the cut out area 508.

FIG. 5b is another cross-sectional view, and shows that the first and second pairs of downward extending guides 505a (505b not visible in this view) and 505f (505e not visible in this view) are separated by a distance W3, while the first and second pairs of upward extending guides 509a (509b not visible in this view) and 509f (509e not visible in this view) are separated by a distance W4.

The third and fourth pairs of downward-extending guides descend a distance H3 below the top surface 502a of the platform and projects a length D3 along each side of the cut out area 508.

The third and fourth of upward-extending guides ascend a height h3 above the top surface 502a of the platform and projects a length d3 along each side of the cut out area 508.

The actual length of L4 and W4 is related to the dimensions of the package body, namely, L1 and W1, respectively (See, e.g., FIGS. 1 and 2). 2). More specifically, the dimension L4 is slightly greater than the dimension L1, and the dimension W4 is slightly greater than the dimension W1. Typically, the dimensions L4 and W4 are on the order of 0.015+/−0.005 inches greater than the dimensions L1 and W1, respectively, to minimize lateral and rotational movement of the package body, and to optimize the positioning of a semiconductor device assembly on the boat.

Figure 1:
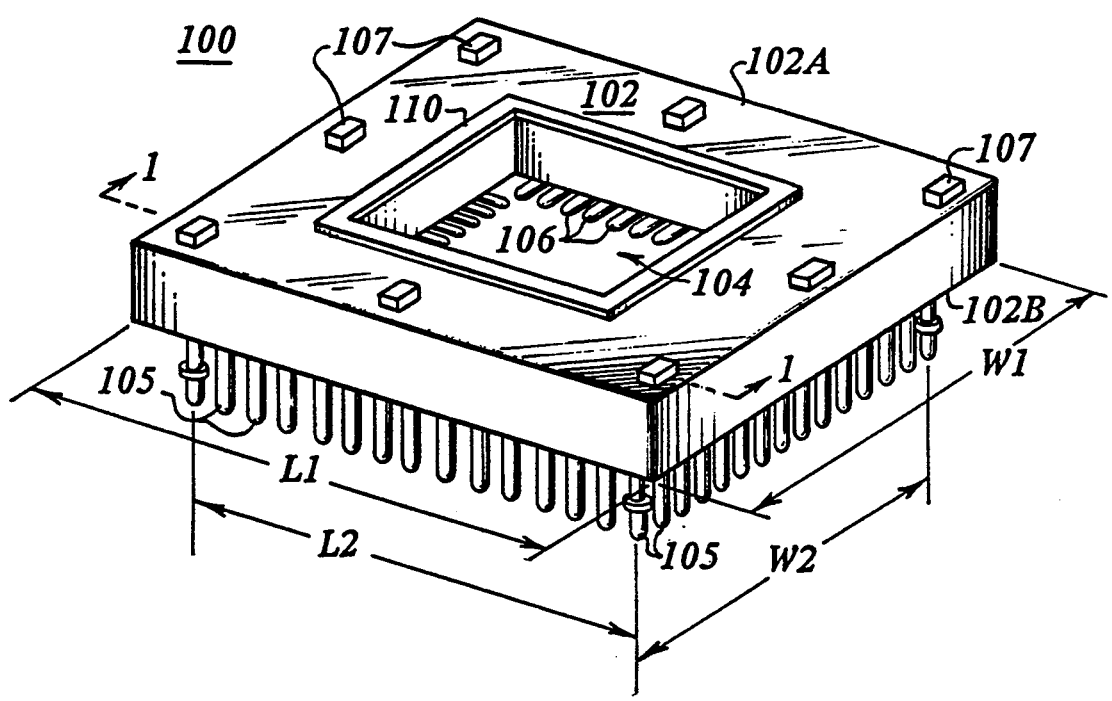
FIG. 1 is a perspective view of the top surface of a prior art pins-down PGA 100.
Figure 2A:
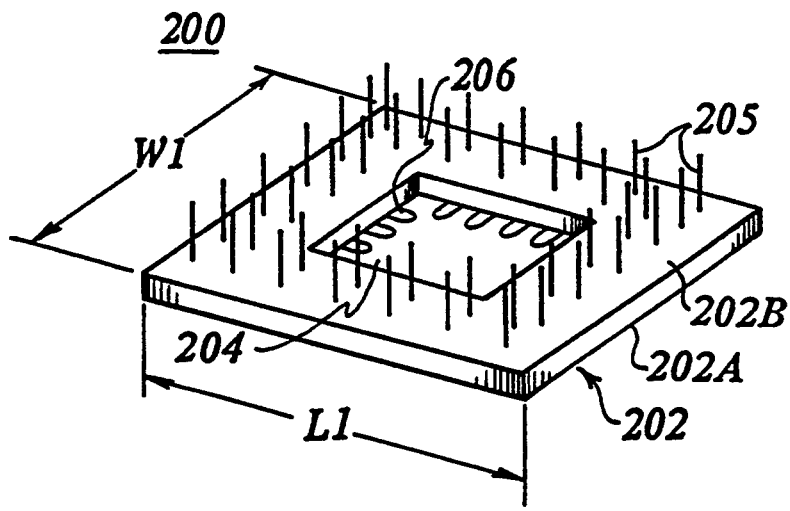
FIG. 2a is a perspective view of the top surface of the PGA 200 of FIG. 2.
Figure 2B:
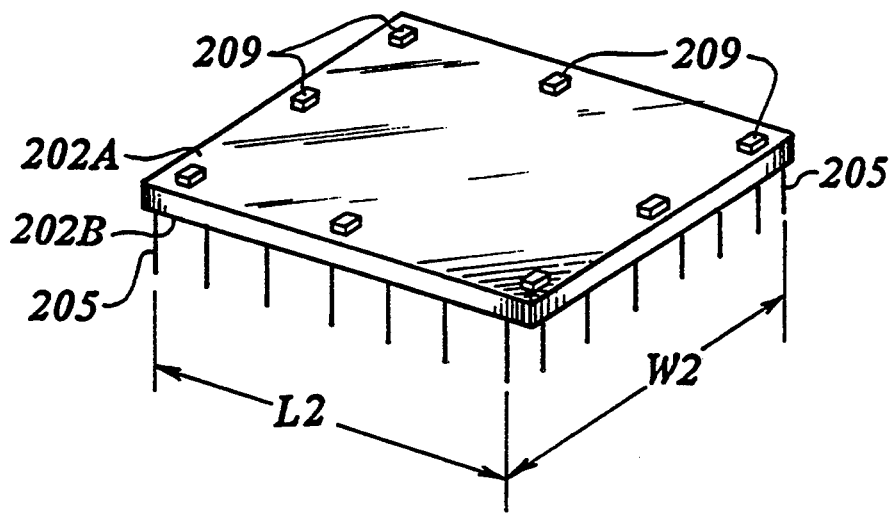
FIG. 2 is a perspective view of the bottom surface of a prior art pins-up PGA 200.
Figure 3:
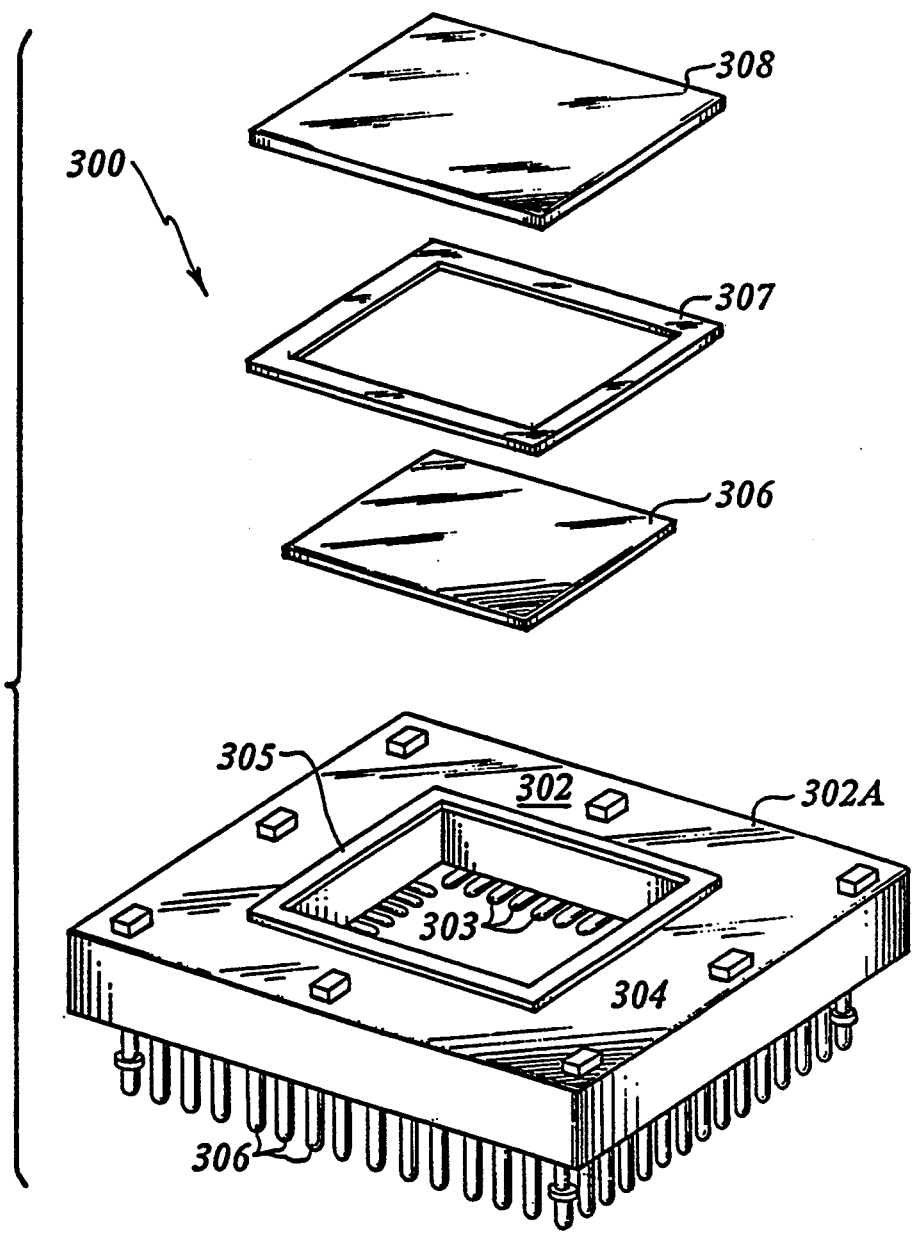
FIG. 3 is an exploded perspective view of a prior art pins-down PGA 300, similar to the PGA 100 of FIG. 1.

Similarly, the dimension L3 is slightly longer than the dimension L2 (see, e.g., FIGS. 1 and 2), and the dimension W3 is slightly greater than the dimension W2 (see, e.g., FIGS. 1 and 2). Typically, the dimensions L3 and W3 are on the order of 0.015+/−0.005 inches greater than the dimensions L2 and W2, respectively, to minimize lateral movement of the package body and to and optimize the positioning of a semiconductor device assembly on the boat.

Referring to FIG. 5, it can be seen that a plurality (eight shown) of "shelves" 510 are formed on the platform, upon which a peripheral portion of the package body can rest. The downward extending guides 505a . . . 505h prevent pins-down packages from moving, and the upward-extending guides 509a . . . 509h prevent lateral and rotational movement of both pins-down and pins-up type packages.

Cutouts located at the corners 520 and side midpoints 530 of the cutout area 508 allow chip capacitors (e.g., 209 of FIG. 2) on pins-up PGAs to freely pass through the platform, unimpeded (without contacting the platform, or any part of the boat transport 500), and are evidently sized and shaped suitably to accomplish this purpose.

The actual width D2, D3 of each downward extending guide is determined by the dimension of the chip capacitors 209 and the corresponding corner cutouts 520 and side midpoint cutouts 530. Typically, each downward extending guide width D2, D3 will be of equal size, with the cumulative lengths, i.e. for each pair of guides on each side of the cutout area 508, covering approximately 80% of the pins on the outer most row, to minimize lateral movement of the pins-down package.

The length H2, H3 of each downward extending guide (505a,505b,505c,505d,505e,505f,505g,505h) is at least as long as the pin length H1 (FIG. 1a) such that the pins 105 are protected from external lateral contact. Typically, the dimensions H2 and H3 will be equal to one another.

Figure 1A:
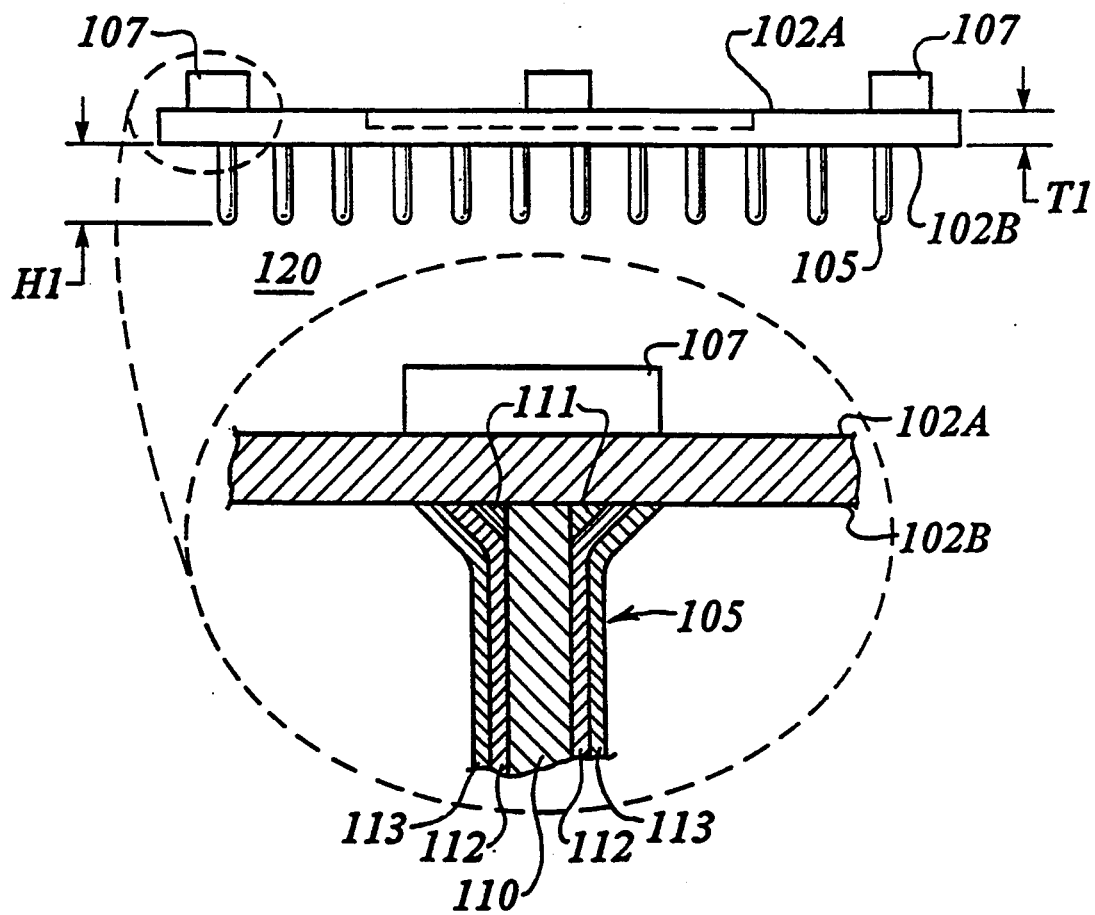
FIG. 1a is a cross-sectional view detailing the pins of the PGA 100 of FIG. 1.
Figure 1B:
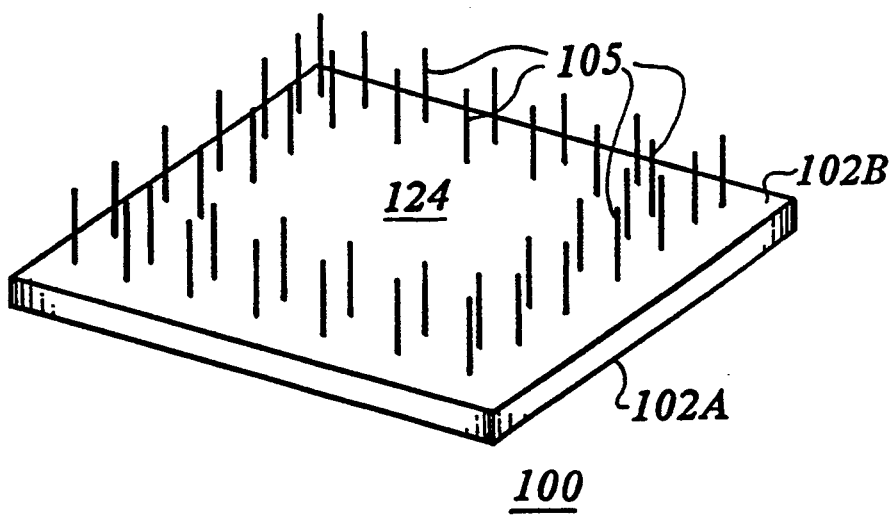
FIG. 1b is a perspective view of the bottom surface of the PGA 100 of FIG. 1.

The length h2, h3 of each upward extending guide (509a,509b,509c,509d,509e,509f,509g,509h) is approximately as long as the thickness T1 of the package body (FIG. 1a). Typically, the dimensions h2 and h3 will be equal to one another.

The width d2, d3 of each upward extending guide is slightly longer than its height h2, h3, typically 50% longer. Each upward extending guide is spaced proportionately along each side of the cutout area 508 so that rotational movement of a pins-up package and pins-down package is minimized.

Figure 6:
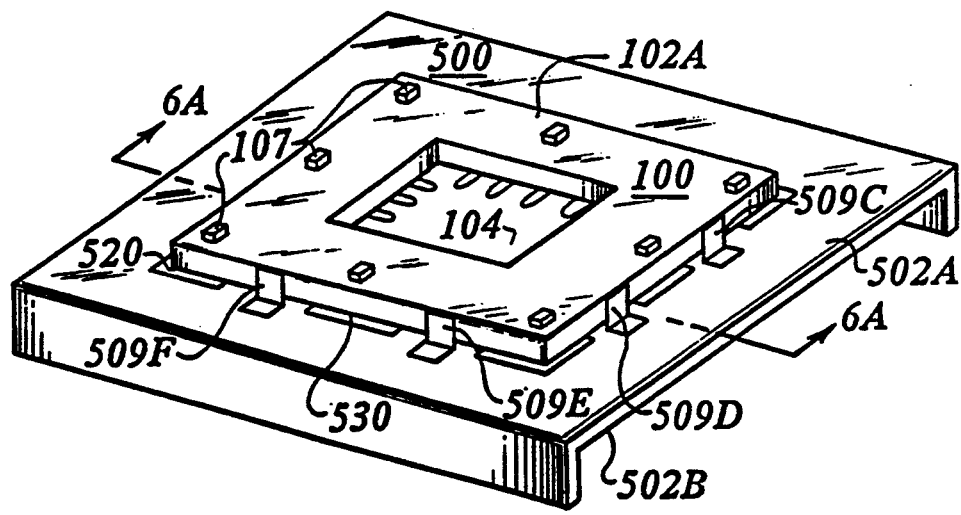
FIG. 6 is a partial perspective view of the boat transport 500 of FIG. 5, supporting a pins-down PGA such as the PGA 100 of FIG. 1.
Figure 6A:
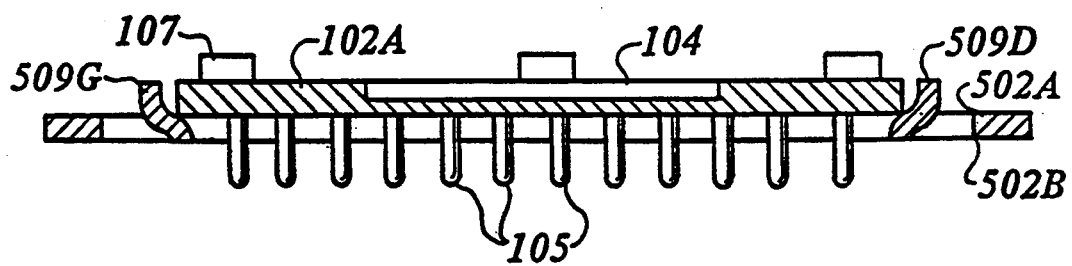
FIG. 6a is a cross sectional side view of the boat transport 500, taken on a line 6a—6a through FIG. 6.

FIG. 6 and 6a shows a boat transport 500 according to the present invention transporting a pins-down package 100. As mentioned previously, a package essentially rests on the shelves 510 of the platform area 502 and is prevented from moving laterally by the upward extending guides. The pins are then protected from external lateral contact by the downward extending guides.

Figure 7:
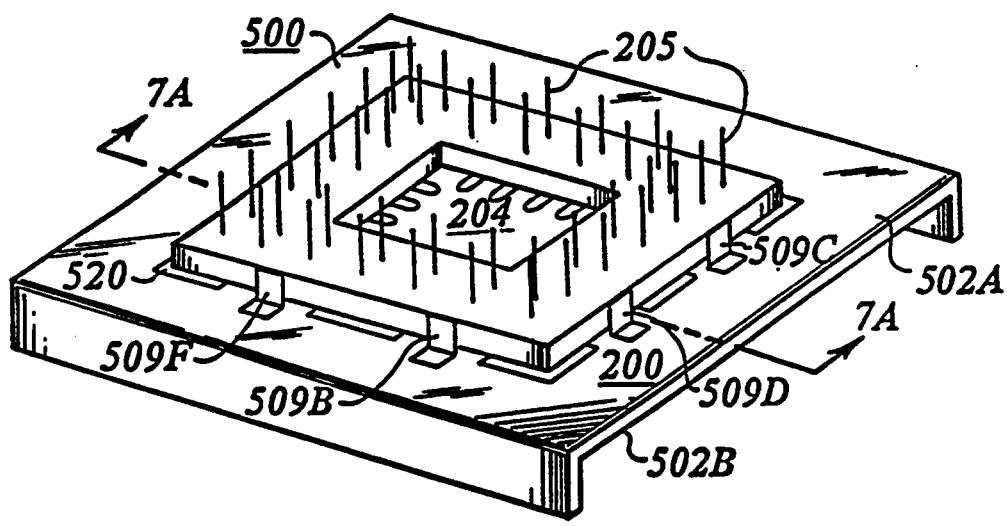
FIG. 7 is a partial perspective view of the boat transport 500 of FIG. 5, supporting a pins-up PGA such as the PGA 200 of FIG. 2.
Figure 7A:
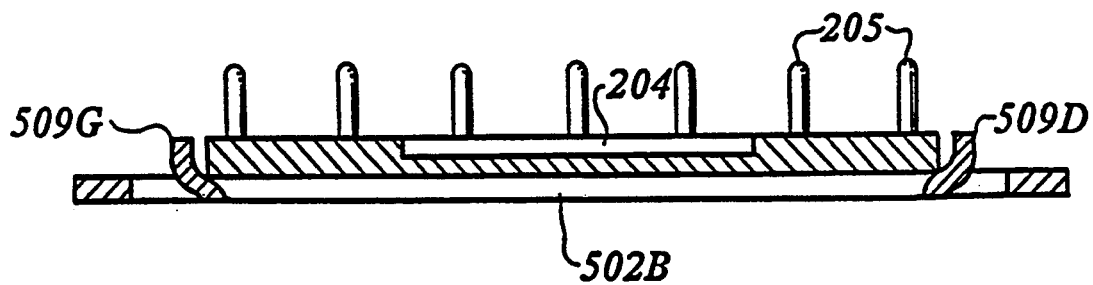
FIG. 7a is a cross sectional side view of the boat transport 500, taken on a line 7a—7a through FIG. 7.

FIGS. 7 and 7a similarly show a boat transport 500 according to the present invention transporting a pins-up package.

In marked contrast to the prior art, in which the pin plating may be gouged or scraped off by the sharp edges of the holes 408, in the present invention, the smoothness and roundness of the guide surface prevents the possible gouging or scarring of the pin plating. Any contact between the boat and pins occurs only at the outside row of pins. The inside pins are never contacted by the boat.

In marked contrast to the prior art, in which the pins were vulnerable to lateral impact and subsequent bending, the downward extending guides of the present invention protect all the pins from any possible lateral impact or collision.

In marked contrast to the prior art, in which the braze area of the pin (FIG. 1a) rested on the boat and was commonly gouged, in the present invention, the downward guides are formed with a radius such that the braze area is never contacted, eliminating any possible gouging of that area.

The boat transport of FIG. 5 will provide results superior to boat transports of the prior art. With L3 and W3 0.012 inches wider than L2 and W2, respectively, and H2, H3 extending 0.180 inches below the platform 502 surface, semiconductor device assemblies of the pins-down and pins-up types can be repeatedly processed without damaging the pin, pin braze area, or the ceramic body.

An advantage of using this improved boat is that the areas of contact between the pins and the boat is minimized and limited to pins on the outer rows (and columns) of the pin grid array, thereby eliminating contact at the pin braze area and eliminating scraping and gouging of the pin plating in that area.

Another advantage of using this improved boat is that the areas of contact between the pins and the boat are rounded (i.e., the downward-extending guides) and blunt, thereby eliminating scraping to the pin plating in the pin body.

Another advantage of using this improved boat is that it can be universally used for both pins-down and pins-up type PGA's, thereby eliminating the need to keep two boats in inventory.

What is claimed is:

1. A boat transport in combination with a semiconductor device assembly having a package body including a surface and a plurality of pins that extend a selected distance in an array from the surface of the package body that has a thickness and a first dimension across the array of pins less than a second dimension across a peripheral portion of the package body, the boat transport comprising:
   a planar platform including a top surface for supporting thereon the peripheral portion of the package body of the semiconductor device assembly;
   a single cutout through the platform having two pairs of opposed sides for receiving within the cutout between the pairs of opposed sides the plurality of pins that extend in the array from the package body of the semiconductor device assembly;
   downward guides formed integrally with the platform as tabs on each of the opposite sides of the cutout and extending downward from the top surface of the platform in substantially planar alignment on each of the opposite sides and at a distance between downward guides on opposed sides of the cutout which is greater than the first dimension and less than the second dimension; and
   upward guides integrally formed with the platform as tabs near each of the opposed sides of the cutout extending upward from the top surface of the platform in substantially planar alignment near each of the opposed sides, and in plane parallel orientation with the downward guides on each of the corresponding opposed sides, and at a distance between upward guides on opposed sides of the cutout which is greater than the second dimension.

2. A boat transport according to claim 1, wherein: each downward guide extends from the top surface of the platform downward a distance which is at least as long as the selected distance that the pins of the semiconductor device assembly supported on the top surface of the platform extend through the cutout.

3. A boat transport according to claim 1, wherein: each downward guide forms a rounded and smooth intersection with the top surface of the platform.

4. A boat transport according to claim 1, wherein: each upward guide ascends from the top surface of the platform a distance which is at least approximately equal to the thickness of the package body supported on the top surface of the platform.

5. A boat transport according to claim 1, further comprising:
   leg portions extending downward from opposite sides of the platform a distance at least greater than the selected distance that the pins of the semiconductor device assembly supported on the top surface of the platform extend through the cutout.

* * * * *